US012613275B2

(12) United States Patent
Seeger et al.

(10) Patent No.: US 12,613,275 B2
(45) Date of Patent: Apr. 28, 2026

(54) TEST AND/OR MEASUREMENT SYSTEM

(71) Applicant: Rohde & Schwarz GmbH & Co. KG, Munich (DE)

(72) Inventors: Julius Seeger, Munich (DE); Martin Burgmair, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 186 days.

(21) Appl. No.: 18/680,630

(22) Filed: May 31, 2024

(65) Prior Publication Data

US 2025/0370041 A1      Dec. 4, 2025

(51) Int. Cl.
*G01R 31/02* (2006.01)
*G01R 31/317* (2006.01)

(52) U.S. Cl.
CPC .............................. *G01R 31/31727* (2013.01)

(58) Field of Classification Search
CPC .. G01R 31/31727; G01R 23/00; G01R 23/02; G01R 23/04–10
See application file for complete search history.

(56) References Cited

U.S. PATENT DOCUMENTS

| | | | | |
|---|---|---|---|---|
| 5,920,595 | A | * 7/1999 | Iwamatsu | H03D 7/166 |
| | | | | 375/376 |
| 9,292,037 | B2 | 3/2016 | Siddique | |
| 2019/0079175 | A1* | 3/2019 | Yamanouchi | G01S 13/40 |
| 2020/0103473 | A1* | 4/2020 | Guo | G01R 33/0029 |
| 2021/0083781 | A1* | 3/2021 | Al-Qaq | H04B 17/12 |

* cited by examiner

*Primary Examiner* — Thang X Le
(74) *Attorney, Agent, or Firm* — CHRISTENSEN O'CONNOR JOHNSON KINDNESS PLLC

(57)     ABSTRACT

A system includes first and second measurement circuits. The first measurement circuit includes a local oscillator (LO) circuit that is configured to generate an LO signal, a first signal distribution circuit, a first analog-to-digital converter (ADC), and a first LO port. The first signal distribution circuit is configured to receive the LO signal and to forward the LO signal to the first LO port. The second measurement circuit includes a second signal distribution circuit, a second ADC, and a second LO port. The test and/or measurement system further includes a processing circuit that is connected to both the first ADC and the second ADC. The second LO port is connected to the first LO port so as to receive the LO signal. The second LO port is connected to the second signal distribution circuit such that the LO signal is forwarded to the second signal distribution circuit.

20 Claims, 6 Drawing Sheets

TEST AND/OR MEASUREMENT SYSTEM

FIELD OF THE DISCLOSURE

Embodiments of the present disclosure generally relate to a test and/or measurement system.

BACKGROUND

Certain types of tests performed on one or more electronic devices under test require a precise synchronization of two or more measurement circuits each comprising an analog-to-digital converter (ADC), such that a temporal relation between the samples obtained by the different ADCs is known.

Phase drifts of clock modules generating clock signals for different components of the measurement circuits based on a reference clock signal pose a major challenge for the synchronization of the measurement circuits, as these phase drifts may negatively impact the synchronization of the measurement circuits and thus the validity of measurement results obtained.

One possibility to address this type of phase drift is to perform a calibration of the test and/or measurement system with external equipment. However, performing a calibration with external equipment is accompanied by additional time and effort that a user of the test and/or measurement system has to expend.

Thus, there is a need for a test and/or measurement system that allows to efficiently compensate for phase drift effects.

SUMMARY

The following summary of the present disclosure is intended to introduce different concepts in a simplified form that are described in further detail in the detailed description provided below. This summary is neither intended to denote essential features of the present disclosure nor shall this summary be used as an aid in determining the scope of the claimed subject matter.

Embodiments of the present disclosure provide a test and/or measurement system. In an embodiment, the test and/or measurement system comprises a first measurement circuit and a second measurement circuit. The first measurement circuit comprises a local oscillator (LO) circuit that is configured to generate an LO signal. The first measurement circuit further comprises a first signal distribution circuit, a first analog-to-digital converter (ADC), and a first LO port. The first signal distribution circuit is configured to receive the LO signal and to forward the LO signal to the first LO port. The second measurement circuit comprises a second signal distribution circuit, a second ADC, and a second LO port.

The test and/or measurement system further comprises a processing circuit that is connected to both the first ADC and the second ADC. The second LO port is connected to the first LO port so as to receive the LO signal from the first LO port. The second LO port is connected to the second signal distribution circuit such that the LO signal is forwarded from the second LO port to the second signal distribution circuit.

In an embodiment, the test and/or measurement system has an adjustment mode, wherein, in the adjustment mode, the first signal distribution circuit is configured to forward the LO signal to the first ADC and the second signal distribution circuit is configured to forward the LO signal to the second ADC. The first ADC is configured to digitize the LO signal, thereby obtaining a first digitized LO signal. The second ADC is configured to digitize the LO signal, thereby obtaining a second digitized LO signal. The processing circuit is configured to receive the first digitized LO signal and the second digitized LO signal.

The test and/or measurement system according to one or more aspects of the present disclosure is based on the idea to use the LO signal in order to correct for phase drift occurring in the test and/or measurement system, namely by routing the LO signal to the ADCs in the adjustment mode and forwarding the digitized LO signals to the processing circuit.

As will be described in more detail below, the processing circuit is configured to determine a phase drift between the digitized LO signals, such that phase drifts occurring in the test and/or measurement system can be compensated and the measurement circuits can be properly synchronized.

For example, the first ADC and the second ADC may digitize the LO signals based on a sampling clock that is derived from a reference clock signal, respectively. The sampling clocks of the ADCs may drift with respect to the reference clock signal, respectively.

By determining a phase drift between the digitized LO signals, such phase drifts can be compensated by taking the phase drifts into account for an error correction performed by the processing circuit.

In an embodiment, the first measurement circuit and the second measurement circuit may be efficiently synchronized based on the first digitized LO signal and based on the second digitized LO signal. Accordingly, instead of using external calibration equipment or providing additional internal calibration sources, the LO signal is distributed between the measurement circuits and used for error correction and/or synchronization. As the LO signal has to be generated for measurements anyway, there is no additional cabling effort and/or hardware effort necessary in order to correct for the phase drift and/or in order to synchronize the measurement circuits.

According to an aspect of the present disclosure, the processing circuit, for example, is configured to determine a phase drift between the first digitized LO signal and the second digitized LO signal based on the first digitized LO signal and the second digitized LO signal received in the adjustment mode. The phase drift may be a time delay between the first digitized LO signal and the second digitized LO signal.

In general, the phase drift between the digitized LO signals is a measure for phase drifts occurring in the test and/or measurement system, such as for phase drifts of sampling clocks of the ADCs that may be derived from a reference clock signal provided by the test and/or measurement system.

In an embodiment, the sampling clock used by the first ADC may be provided by a first reference clock signal generator, and the sampling clock used by the second ADC may be provided by a second reference clock signal generator, wherein the first reference clock signal generator and the second reference clock signal generator may be coupled, e.g. by a phase-locked loop. This coupling may also be subject to phase drift, which may be accounted for based on the determined phase drift between the digitized LO signals.

In an embodiment of the present disclosure, the processing circuit is configured to determine the phase drift by applying a correlation operation to the first digitized LO signal and the second digitized LO signal received in the adjustment mode. In general, by applying the correlation operation to the first digitized LO signal and the second digitized LO signal, a displacement between the digitized LO signals and thus a phase drift between the digitized LO signals can be determined.

For example, the correlation operation may comprise determining a cross-correlation between the digitized LO signals. As another example, the correlation operation may comprise a fit function that is applied to the digitized LO signals. In a further example, the correlation operation may comprise a multiplication of the first digitized LO signal and the second digitized LO signal, for example a convolution of the first digitized LO signal with the second digitized LO signal.

According to another aspect of the present disclosure, the test and/or measurement system, for example, is configured to adapt a frequency of the LO signal generated by the LO circuit and/or a phase of the LO signal generated by the LO circuit at least once during the adjustment mode, such that at least two different LO signals having different frequencies and/or phases are generated. As will be described in more detail below, the accuracy of the synchronization between the measurement circuits and/or of the error correction can be enhanced significantly by generating at least two different LO signals having different frequencies and/or different phases.

In an embodiment, the processing circuit may be configured to control the LO circuit to generate the at least two different LO signals having different frequencies and/or phases. However, it is also conceivable that the LO circuit may be configured to receive an external trigger signal, wherein the external trigger signal may cause the LO circuit to generate the different LO signals.

A further aspect of the present disclosure provides, for example, that the first ADC is configured to digitize the at least two different LO signals, thereby obtaining at least two different first digitized LO signals, wherein the second ADC is configured to digitize the at least two different second LO signals, thereby obtaining at least two different second digitized LO signals. The processing circuit may be configured to determine a phase drift between the first digitized LO signal and the second digitized LO signal based on the at least two different first digitized LO signals and based on the at least two different second digitized LO signals received in the adjustment mode. It has turned out that, by choosing appropriate frequencies and/or phases of the at least two different LO signals, the first measurement circuit and the second measurement circuit can be synchronized in a particularly precise manner.

For example, the processing circuit may receive the first digitized LO signal having a first frequency in a certain time period, and may receive the first digitized LO signal having a second frequency after that time period. The processing circuit may digitally extrapolate the first digitized LO signal having the first frequency to the region after the certain time period. The processing circuit may then determine a first reference time at which both first digitized LO signals have a zero-crossing simultaneously.

In an embodiment, the processing circuit may perform the same steps for the second digitized LO signal having the first frequency and the second digitized LO signal having the second frequency, and thus may determine a second reference time.

Determining the first reference time and the second reference time allows to precisely match corresponding samples of the first ADC and of the second ADC, as the sample of the first ADC at the first reference time has to correspond to the sample of the second ADC at the second reference time. Thus, the first ADC and the second ADC can be synchronized in a particularly precise manner by determining the reference times.

Further, a difference between the first reference time and the second reference time may be a measure for the phase drift between the digitized LO signals. Accordingly, phase drift errors may be corrected based on the determined reference times.

In an embodiment, the test and/or measurement system may further comprise a first signal adjustment circuit and/or a second signal adjustment circuit. The first signal adjustment circuit may be interconnected between the first signal distribution circuit and the first ADC. The first signal adjustment circuit may be configured to amplify, filter, and/or attenuate a signal received from the first signal distribution circuit. The second signal adjustment circuit may be interconnected between the second signal distribution circuit and the second ADC. The second signal adjustment circuit may be configured to amplify, filter, and/or attenuate a signal received from the second signal distribution circuit. In general, the signal received by the first signal adjustment circuit may be the LO signal or a measurement signal that is to be analyzed. Likewise, the signal received by the second signal adjustment circuit may be the LO signal or a measurement signal that is to be analyzed.

According to an aspect of the present disclosure, the first measurement circuit further comprises, for example, a first frequency converting circuit as well as a first RF port. Alternatively or additionally, the second measurement circuit further comprises a second frequency converting circuit as well as a second RF port. The first RF port may be configured to receive a first measurement signal, wherein the first frequency converting circuit is connected to the first RF port, wherein the first frequency converting circuit is configured to down-convert the first measurement signal to an intermediate frequency, and wherein the first signal distribution circuit is configured to selectively connect the first frequency converting circuit or the first RF port to the first ADC. The second RF port may be configured to receive a second measurement signal, wherein the second frequency converting circuit is connected to the second RF port, wherein the second frequency converting circuit is configured to down-convert the second measurement signal to an intermediate frequency, and wherein the second signal distribution circuit is configured to selectively connect the second frequency converting circuit or the second RF port to the second ADC.

In general, the first measurement signal may be a signal received from a device under test. If the first measurement signal is a radio frequency (RF) signal, the first measurement signal may be down-converted in frequency and then forwarded to the first ADC. If the first measurement signal is a baseband signal, the first frequency converting unit may be bypassed, and the first measurement signal may be forwarded to the first ADC bypassing the first frequency converting unit.

Likewise, the second measurement signal may be a signal received from a device under test. If the second measurement signal is a radio frequency (RF) signal, the second measurement signal may be down-converted in frequency and then forwarded to the second ADC. If the second measurement signal is a baseband signal, the second frequency converting unit may be bypassed, and the second measurement signal may be forwarded to the second ADC bypassing the second frequency converting unit.

In an embodiment, the first measurement signal and the second measurement signal may correspond to the same measurement signal. Alternatively, the first measurement signal and the second measurement signal may correspond to different measurement signals.

In an embodiment of the present disclosure, the test and/or measurement system has a first measurement mode, wherein, in the first measurement mode, the first signal distribution circuit is configured to forward the LO signal to both the first LO port and the first frequency converting circuit, and wherein the second distribution circuit is configured to forward the LO signal from the second LO port to the second frequency converting circuit. Accordingly, in the first measurement mode, the first frequency converting circuit may be configured to down-convert the first measurement signal based on the LO signal, for example by mixing the first measurement signal with the LO signal. Likewise, in the first measurement mode, the second frequency converting circuit may be configured to down-convert the second measurement signal based on the LO signal, for example by mixing the second measurement signal with the LO signal.

Accordingly, the first measurement mode may be associated with analyzing RF measurement signals that have to be down-converted in frequency before analysis.

In a further embodiment of the present disclosure, the test and/or measurement system has a second measurement mode, wherein, in the second measurement mode, the first signal distribution circuit is configured to forward the first measurement signal to the first ADC, and wherein the second signal distribution circuit is configured to forward the second measurement signal to the second ADC.

Accordingly, the second measurement mode may be associated with analyzing baseband measurement signals that do not have to be down-converted in frequency before analysis.

In the second measurement mode, a signal path between the first RF port and the first ADC may be free of frequency converting circuits, and a signal path between the second RF port and the second ADC may be free of frequency converting circuits.

In an embodiment, the first frequency converting circuit and the second frequency converting circuit may be bypassed in the second measurement mode.

In an embodiment of the present disclosure, the first ADC is configured to digitize the first measurement signal, thereby obtaining a first digitized measurement signal, wherein the second ADC is configured to digitize the second measurement signal, thereby obtaining a second digitized measurement signal.

In the first measurement mode described above, the first digitized measurement signal is obtained by digitizing the first measurement signal that is down-converted in frequency by the first frequency converting unit. Likewise, the second digitized measurement signal is obtained by digitizing the second measurement signal that is down-converted in frequency by the second frequency converting unit.

In the second measurement mode described above, the first digitized measurement signal is obtained by digitizing the first measurement signal without prior frequency-conversion. Likewise, the second digitized measurement signal is obtained by digitizing the second measurement signal without prior frequency-conversion.

In another embodiment of the present disclosure, the processing circuit is configured to determine a phase drift between the first digitized LO signal and the second digitized LO signal based on the first digitized LO signal and the second digitized LO signal received in the adjustment mode, wherein the processing circuit is configured to correct a phase drift between the first digitized measurement signal and the second digitized measurement signal based on the phase drift determined. In other words, measurement data obtained by the measurement circuits, for example in the first measurement mode or in the second measurement mode, can be corrected for phase drifts occurring in the test and/or measurement system based on the digitized LO signals obtained in the adjustment mode.

In an embodiment, by determining the phase drift between the first digitized LO signal and the second digital LO signal, samples of the first digitized measurement signal corresponding to samples of the second digitized measurement signal can be identified, such that the digitized measurement signals can be correctly aligned or synchronized for analysis of the digitized measurement signals.

In an embodiment, the at least two measurement circuits may comprise a third measurement circuit, wherein the third measurement circuit comprises a third signal distribution circuit, a third ADC, and a third LO port, wherein the third LO port is connected to the first LO port so as to receive the LO signal.

In an embodiment, the second LO port and the third LO port may be connected to the first LO port by a star connection, such that the LO signal is forwarded from the first LO port to the second LO port and to the third LO port independently.

In an embodiment of the present disclosure, the at least two measurement circuits comprise a third measurement circuit, wherein the third measurement circuit comprises a third signal distribution circuit, a third ADC, and a third LO port, wherein the third LO port is connected to the second LO port so as to receive the LO signal.

Accordingly, the first LO port, the second LO port, and the third LO port may be connected in series, i.e. in a daisy chain, such that the LO signal is first forwarded from the first LO port to the second LO port, and then from the second LO port to the third LO port.

According to an aspect of the present disclosure, the at least two measurement circuits, for example, comprise a third measurement circuit, wherein the third measurement circuit comprises a third signal distribution circuit, a third ADC, and a third LO port, wherein the third LO port is connected to the first LO port so as to receive the LO signal, and wherein the third LO port is connected to the third signal distribution circuit such that the LO signal is forwarded from the third LO port to the third signal distribution circuit. In the adjustment mode, the third ADC is configured to digitize the LO signal, thereby obtaining a third digitized LO signal, wherein the processing circuit is configured to receive the third digitized LO signal. Accordingly, the processing circuit may correct measurement results for phase drifts occurring in the test and/or measurement system and/or may synchronize the measurement circuits based on the first digitized LO signal, the second digitized LO signal, and the third digitized LO signal.

The explanations and aspects given above with respect to the first measurement circuit and the second measurement circuit likewise apply to the third measurement circuit.

It is to be understood that the at least two measurement circuits may comprise an arbitrary number of measurement circuits that may be synchronized as described above with respect to the first measurement circuit and the second measurement circuit.

In an embodiment, the processing circuit may be configured to determine a phase drift between the first digitized LO signal, the second digitized LO signal, and the third digitized LO signal based on the first digitized LO signal, the second digitized LO signal, and the third digitized LO signal received in the adjustment mode. For example, the processing circuit may be configured to determine pairwise phase drifts between the first digital LO signal, the second digitized LO signal, and the third digitized LO signal.

In another embodiment of the present disclosure, the first measurement circuit and the second measurement circuit are provided on separate circuit boards and/or in separate housings. Accordingly, the first measurement circuit and the second measurement circuit may be physically distinct circuits that are provided on physically distinct circuit boards and/or in physically distinct devices each having a housing.

Another aspect of the present disclosure provides, for example, that the processing circuit is integrated into the first measurement circuit and/or the second measurement circuit. Accordingly, the processing circuit may be completely integrated into the first measurement circuit. Alternatively, the processing circuit may be completely integrated into the second measurement circuit.

Alternatively, the processing circuit may be partially integrated into the first measurement circuit, and partially integrated into the second measurement circuit. In this case, a data connection may be provided between the portion of the processing circuit integrated into the first measurement circuit and the portion of the processing circuit being integrated into the second measurement circuit.

In general, for at least one embodiment, some embodiments, or in some cases all embodiments, described above and hereinafter, the processing circuit forms a single logical unit.

In an embodiment, the processing circuit may be provided separately from the first measurement circuit and the second measurement circuit. In an embodiment, the processing circuit may be established separately from the first measurement circuit and separately from the second measurement circuit, for example on a physically distinct circuit board and/or in a separate housing.

In an embodiment of the present disclosure, the first signal distribution circuit comprises at least one of a directional coupler, a power divider, a switch, a splitter, or a diplexer. For example, the power divider may be a Wilkinson power divider.

However, it is to be understood that the first signal distribution circuit and/or the second signal distribution circuit may comprise any other suitable components that are configured to perform the functionalities described above.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
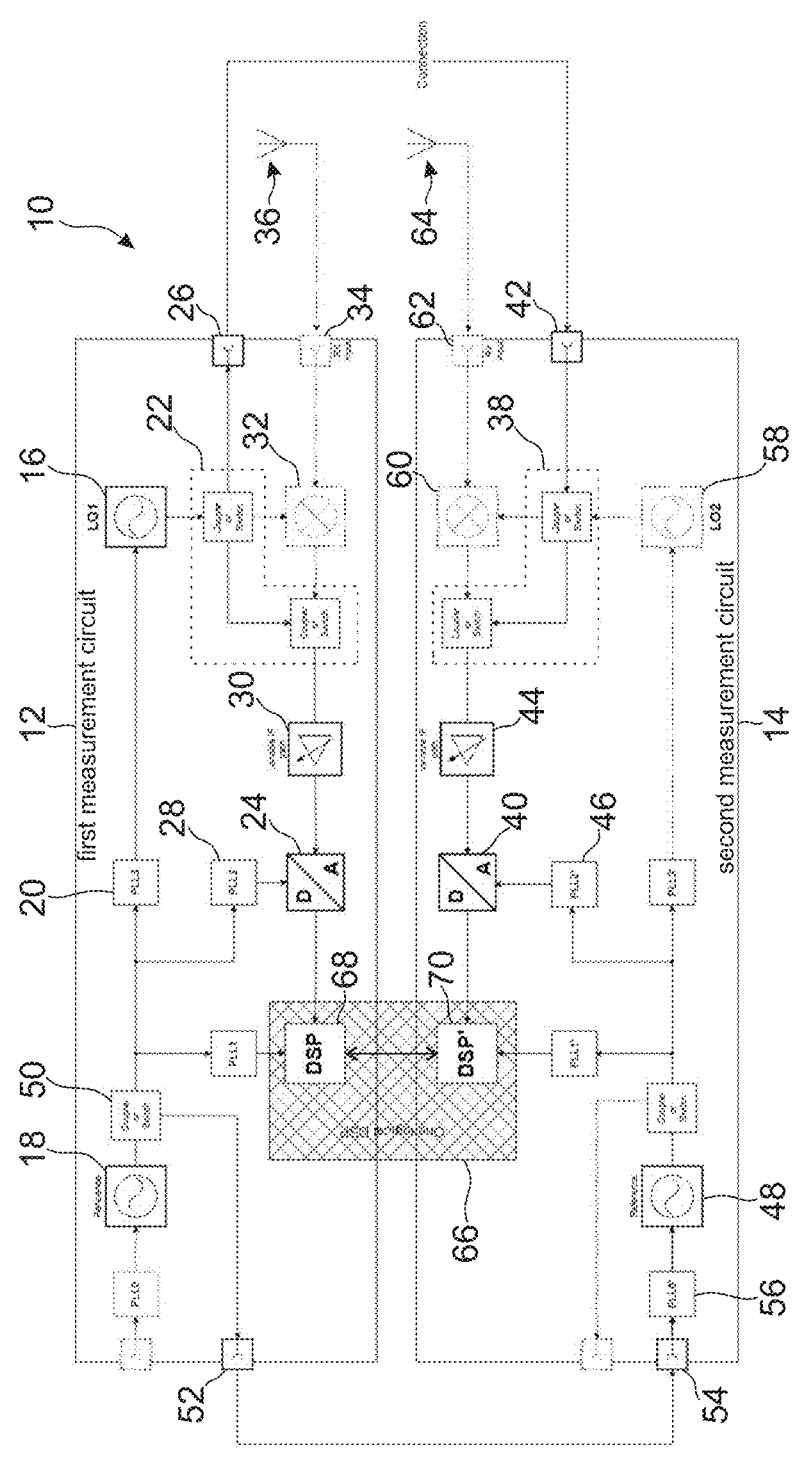
FIG. 1 schematically shows an example of a test and/or measurement system according to an embodiment of the present disclosure in a first operational mode.

FIG. 1 schematically shows an example of a test and/or measurement system 10 in accordance with an embodiment of the present disclosure. As shown in FIG. 1, the system 10 comprises a first measurement circuit 12 and a second measurement circuit 14. In general, the test and/or measurement system 10 is configured to perform measurements on a device under test or on several devices under test by the measurement circuits 12, 14.

In an embodiment, the first measurement circuit 12 and the second measurement circuit 14 may be physically distinct circuits that are provided on physically distinct circuit boards and/or in physically distinct devices each having a housing. For example, the test and/or measurement system 10 may comprise a first test and/or measurement instrument having a housing, wherein the first test and/or measurement instrument comprises the first measurement circuit 12. In this example, the test and/or measurement system 10 may further comprise a second test and/or measurement instrument having a further housing, wherein the second test and/or measurement instrument comprises the second measurement circuit 14.

In the embodiment of FIG. 1, the first measurement circuit 12 comprises an LO circuit 16 that is configured to generate an LO signal. For example, the LO circuit 16 may be or comprise a voltage-controlled oscillator (VCO). In an embodiment, the LO circuit 16 is configured to generate the LO signal based on a clock signal that is equal to or derived from a first reference clock signal.

In the example embodiment shown in FIG. 1, the first measurement circuit 12 comprises a first reference clock signal generator circuit 18 that is configured to generate the first reference clock signal. For example, a frequency of the first reference clock signal may be between 10 MHz and 10 GHz. However, it is to be understood that any other suitable frequencies may be used depending on the application.

The LO circuit 16 is coupled to the first reference clock signal generator circuit 18 by a clock coupling circuit 20 that is configured to derive the clock signal for the LO circuit 16 based on the first reference clock signal, e.g. by frequency division or frequency multiplication. The clock coupling circuit 20 may comprise or be a phase-locked loop.

In the embodiment of FIG. 1, the first measurement circuit 12 further comprises a first signal distribution circuit 22, a first ADC 24, and a first LO port 26. In general, the first signal distribution circuit 22 is configured to forward the LO signal generated by the LO circuit 16 to the first LO port 26. Further, in an adjustment mode of the test and/or measurement system 10, the first signal distribution circuit is configured to forward the LO signal to the first ADC 24.

In the adjustment mode, the first ADC 24 is configured to digitize the LO signal received, thereby obtaining a first digitized LO signal. For example, the first ADC 24 may be configured to digitize the LO signal based on a sampling clock that is derived from the first reference clock signal by a clock coupling circuit 28. The clock coupling circuit 28 may comprise or be a phase-locked loop.

In an embodiment, the first measurement circuit 12 may further comprise a first signal adjustment circuit 30 that may be interconnected between the first signal distribution circuit 22 and the first ADC 24. In general, the first signal adjustment circuit 30 may be configured to amplify, filter, and/or attenuate a signal received from the first signal distribution circuit 22, and to forward the correspondingly processed signal to the first ADC 24. In the adjustment mode described above, the signal received and processed by the first signal adjustment circuit 30 is the LO signal.

In an embodiment, the first measurement circuit 12 further comprises a first frequency converting circuit 32, and a first RF port 34 that is connected to the first frequency converting circuit 32. In general, the first RF port 34 is configured to receive a first measurement signal and to forward the first measurement signal to the first frequency converting circuit 32.

In an embodiment, the first RF port 34 may be connected to a first RF antenna 36 that receives the first measurement signal from a device under test. Alternatively, the first RF port 34 may be connected to the device under test via a cable. In an embodiment, the first measurement signal may be an RF signal or a baseband signal.

If the first measurement signal received is an RF signal, the first frequency converting circuit 32 is configured to down-convert the first measurement signal in frequency, namely to an intermediate frequency. In this case, the down-converted first measurement signal is forwarded to the first signal distribution circuit 22.

In an embodiment, the first frequency converting circuit 32 may receive the LO signal via the first signal distribution circuit 22, and may mix the first measurement signal with the received LO signal, thereby down-converting the first measurement signal.

Of course, the first frequency converting circuit 32 may comprise at least one filter in order to remove unwanted signal components from the first measurement signal mixed with the LO signal.

If the first measurement signal received is a baseband signal, the first frequency converting circuit 32 may be bypassed. In this case, the first measurement signal may be forwarded to the first signal distribution circuit 22.

As is indicated by the dotted lines, the measurement path comprising the first frequency converting circuit 32 and the first RF port 34 may be inactive in the adjustment mode of the test and/or measurement system 10 illustrated in FIG. 1. Accordingly, in the adjustment mode, the first signal distribution circuit 22 may not forward the first measurement signal to the first ADC 24.

The second measurement circuit 14 and the first measurement circuit 12 may be identically constructed, but configured differently, as will be explained hereinafter.

In the embodiment shown in FIG. 1, the second measurement circuit 14 comprises a second signal distribution circuit 38, a second ADC 40, and a second LO port 42. The second LO port 42 is connected to the first LO port 26 so as to receive the LO signal from the first LO port 26. For example, the second LO port 42 may be connected to the first LO port 26 by a cable. In the adjustment mode, the second signal distribution circuit 38 is configured to forward the LO signal received by the second LO port 42 to the second ADC 40.

In an embodiment, a second signal adjustment circuit 44 may be provided between the second signal distribution circuit 38 and the second ADC 40, wherein the second signal adjustment circuit 44 may be configured to amplify, filter, and/or attenuate a signal received from the second signal distribution circuit 44, and to forward the correspondingly processed signal to the second ADC 40.

In the adjustment mode, the second ADC 40 is configured to digitize the LO signal received, thereby obtaining a second digitized LO signal. For example, the second ADC 40 may be configured to digitize the LO signal based on a sampling clock that is derived from a second reference clock signal by a clock coupling circuit 46. In an embodiment, the clock coupling circuit 46 may comprise or be a phase-locked loop.

In the example embodiment shown in FIG. 1, the second measurement circuit 14 comprises a second reference clock signal generator circuit 48 that is configured to generate the second reference clock signal. The second reference clock signal generator circuit 48 may be synchronized to the first reference clock signal generator circuit 18. For example, the first reference clock signal may be forwarded to the second measurement circuit 14 via a coupling and/or switching circuit 50 of the first measurement circuit 14, a first clock port 52 of the first measurement circuit 14, and a second clock port 54 of the second measurement circuit 14.

In an embodiment, the second measurement circuit 14 may comprise a clock coupling circuit 56 that is connected to the second clock port 54 so as to receive the first reference clock signal. The second reference clock signal generator circuit 48 may be synchronized to the first reference clock signal generator circuit 18 by the clock coupling circuit 56. In an embodiment, the clock coupling circuit 56 may comprise or be a phase-locked loop.

As is illustrated by the dashed lines in FIG. 1, the second measurement circuit 14 may comprise a local oscillator circuit 58, which however may be inactive as the second measurement circuit 14 receives the LO signal from the first measurement circuit 14.

In an embodiment, the second measurement circuit 14 further comprises a second frequency converting circuit 60, and a second RF port 62 that is connected to the second frequency converting circuit 60. In general, the second RF port 62 is configured to receive a second measurement signal and to forward the second measurement signal to the second frequency converting circuit 60.

In an embodiment, the second RF port 62 may be connected to a second RF antenna 64 that receives the second measurement signal from a device under test or the device under test described above. Alternatively, the second RF port 62 may be connected to the device under test via a cable. In an embodiment, the second measurement signal may be an RF signal or a baseband signal.

In an embodiment, the second measurement signal may correspond to the same measurement signal as the first measurement signal or to a different measurement signal than the first measurement signal.

If the second measurement signal received is an RF signal, the second frequency converting circuit 60 is configured to down-convert the second measurement signal in frequency, namely to an intermediate frequency. In this case, the down-converted second measurement signal is forwarded to the second signal distribution circuit 38.

In an embodiment, the second frequency converting circuit 60 may receive the LO signal from the second LO port 42 via the second signal distribution circuit 38, and may mix the second measurement signal with the received LO signal, thereby down-converting the second measurement signal.

Of course, the second frequency converting circuit 60 may comprise at least one filter in order to remove unwanted signal components from the second measurement signal mixed with the LO signal.

If the second measurement signal received is a baseband signal, the second frequency converting circuit 60 may be bypassed. In this case, the second measurement signal may be forwarded to the second signal distribution circuit 38.

As is indicated by the dotted lines, the measurement path comprising the second frequency converting circuit 60 and the second RF port 62 may be inactive in the adjustment mode of the test and/or measurement system 10 illustrated in FIG. 1. Accordingly, in the adjustment mode, the second signal distribution circuit 38 may not forward the second measurement signal to the second ADC 40.

In an embodiment, the test and/or measurement system 10 further comprises a processing circuit 66 that is connected to both the first ADC 24 and the second ADC 40. Accordingly, in the adjustment mode, the processing circuit 66 receives the first digitized LO signal from the first ADC 24 and the second digitized LO signal from the second ADC 40.

In the example embodiment shown in FIG. 1, the processing circuit 66 comprises a first digital signal processing sub-circuit 68 that is integrated into the first measurement circuit 12, and a second digital signal processing sub-circuit 70 that is integrated into the second measurement circuit 14. In an embodiment, the first digital signal processing sub-circuit 68 and the second digital signal processing sub-circuit 70 are connected by a data-transmitting connection, such that the signal processing sub-circuits 68, 70 form a single logical unit.

Alternatively, the processing circuit 66 may be completely integrated into the first measurement circuit 12. Alternatively, the processing circuit 66 may be completely integrated into the second measurement circuit 14. Alternatively, the processing circuit 66 may be provided separately from the first measurement circuit 12 and the second measurement circuit 14. In an embodiment, the processing circuit 66 may be established separately from the first measurement circuit 12 and separately from the second measurement circuit 14, for example on a physically distinct circuit board and/or in a separate housing.

Figure 2:
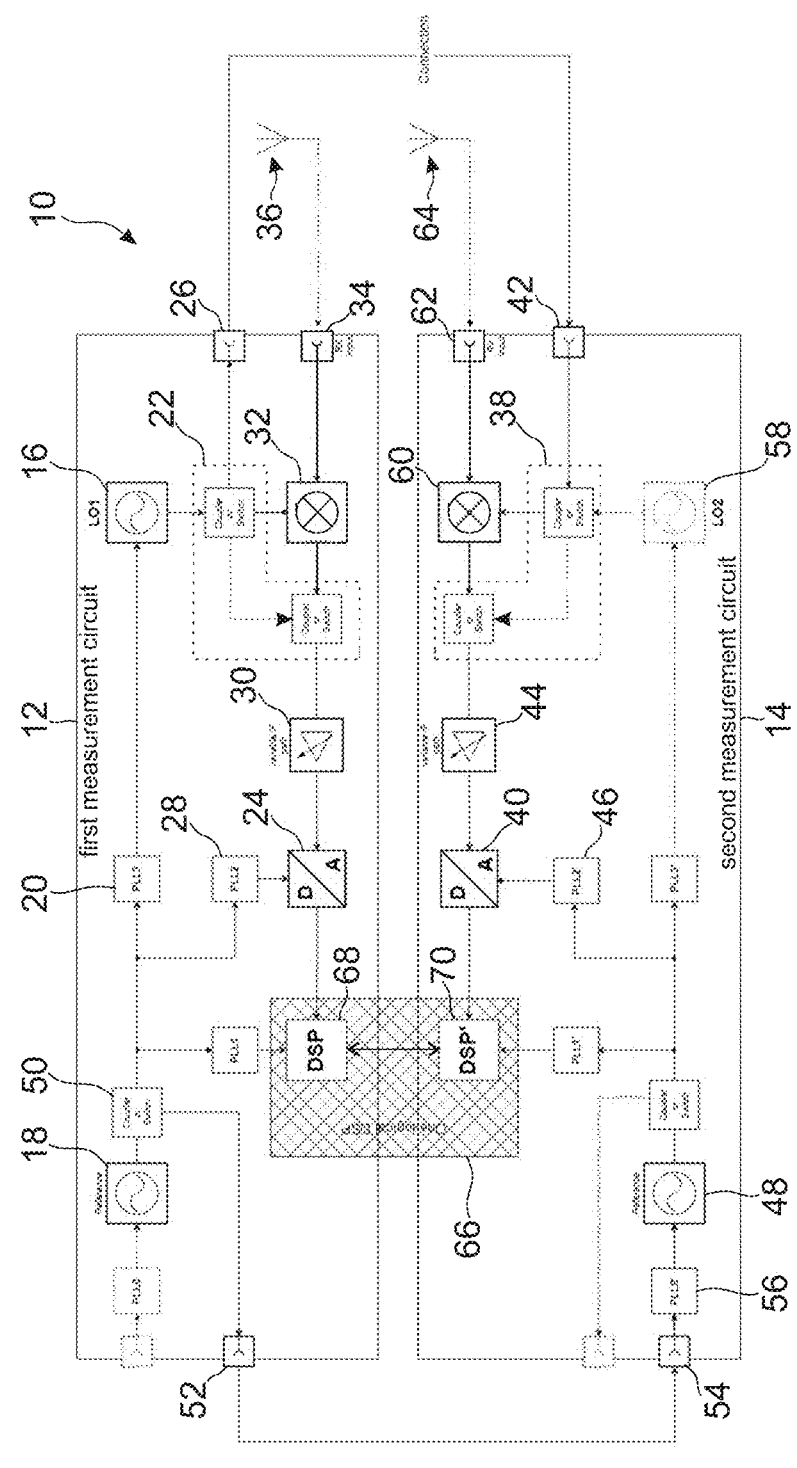
FIG. 2 schematically shows the test and/or measurement system of FIG. 1 in a second operational mode.

FIG. 2 shows the test and/or measurement system 10 described above, however not in the adjustment mode but in a measurement mode. Hereinafter, only the differences compared to the adjustment mode described hereinafter are explained.

The test and/or measurement system 10 has a first measurement mode, which is associated with the measurement signals being RF signals. In the first measurement mode, the first signal distribution circuit 22 is configured to forward the LO signal to both the first LO port 26 and the first frequency converting circuit 32, while the second distribution circuit 38 is configured to forward the LO signal from the second LO port 42 to the second frequency converting circuit 60.

In the first measurement mode, the first signal distribution circuit 22 is configured to forward the down-converted first measurement signal from the first frequency converting circuit 32 to the first ADC 24. Further, the second signal distribution circuit 38 is configured to forward the down-converted second measurement signal from the second frequency converting circuit 60 to the second ADC 40.

In the first measurement mode, the first ADC 24 is configured to digitize the down-converted first measurement signal, thereby obtaining a first digitized measurement signal. The second ADC 40 is configured to digitize the down-converted second measurement signal, thereby obtaining a second digitized measurement signal. The digitized measurement signals are forwarded to the processing circuit 66, respectively.

The test and/or measurement system 10 further has a second measurement mode, which is associated with the measurement signals being baseband signals. In the second measurement mode, the first signal distribution circuit 22 is configured to forward the first measurement signal being a baseband signal to the first ADC 24, and the second signal distribution circuit 38 is configured to forward the second measurement signal being a baseband signal to the second ADC 40.

The first frequency converting circuit 32 and the second frequency converting circuit 60 may be bypassed, such that a signal path between the first RF port 34 and the first ADC 24 is free of frequency converting circuits, and such that a signal path between the second RF port 62 and the second ADC 40 is free of frequency converting circuits.

Figures 3, 4:
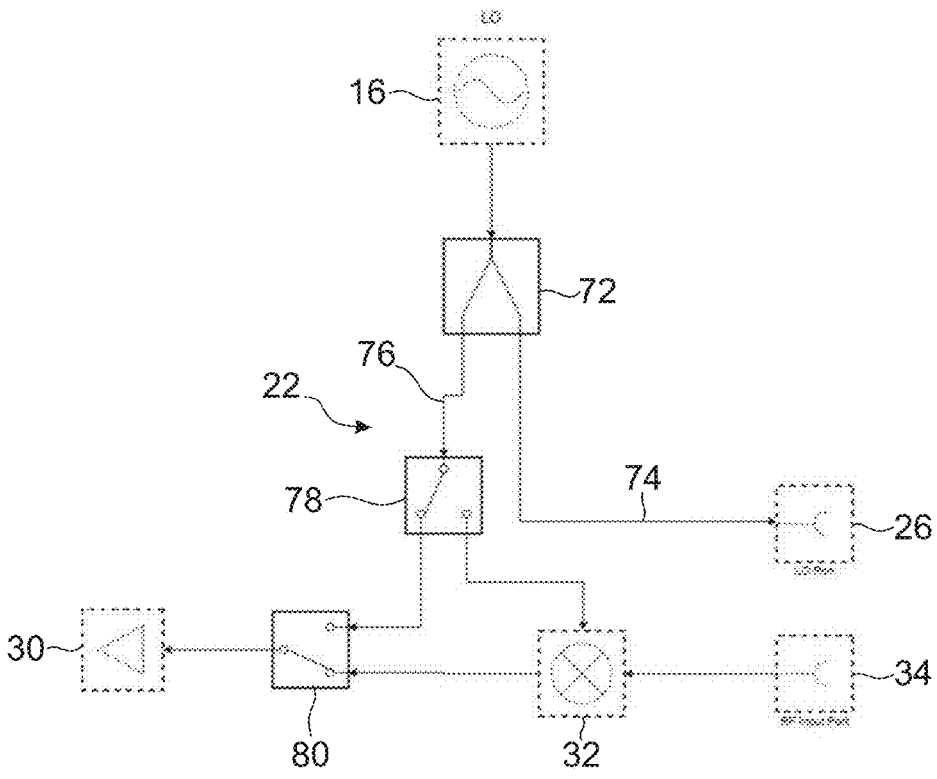
FIG. 3 shows an example of a signal distribution circuit of the test and/or measurement system according to an embodiment of the present disclosure.
FIG. 4 shows another example of a signal distribution circuit of the test and/or measurement system according to an embodiment of the present disclosure.

FIG. 3 shows an example embodiment of the first signal distribution circuit 22 that is associated with the first measurement mode and the adjustment mode described above. It is to be understood that the second signal distribution circuit 38 may be established similarly to the first signal distribution circuit 22, but may be configured differently as described above.

In an embodiment of FIG. 3, the first signal distribution circuit 22 comprises a power divider 72 that is configured to split the LO signal into a first signal path 74 and into a second signal path 76. For example, the power divider 72 may be a Wilkinson power divider.

The first signal path 74 is connected to the first LO port 26, such that the LO signal is forwarded from the power divider 72 to the first LO port 26. The second signal path 76 comprises a first switching circuit 78 and a second switching circuit 80.

In the adjustment mode, the switching circuits 78, 80 are switched such that the LO signal is forwarded to the first ADC 24, namely via the first signal adjustment circuit 30.

In the first measurement mode, the first switching circuit 78 is switched such that the LO signal is forwarded to the first frequency converting circuit 32. The second switching circuit 80 is switched such that the down-converted first measurement signal is forwarded to the first ADC 24.

FIG. 4 shows another example embodiment of the first signal distribution circuit 22 that is associated with the second measurement mode and the adjustment mode described above. Hereinafter, only the differences compared to the first variant of the first signal distribution circuit 22 described above are explained.

As is illustrated in FIG. 4, the first frequency converting circuit 32 may be omitted or bypassed, such that the first switching circuit 78 described above can be omitted or set to the switching position that connects the second switching circuit 80 to the power divider 72. In the adjustment mode, the second switching circuit 80 is switched such that the LO signal is forwarded to the first ADC 24. In the second measurement mode, the second switching circuit 80 is switched such that the first measurement signal being a baseband signal is forwarded to the first ADC 24.

Figures 5, 6:
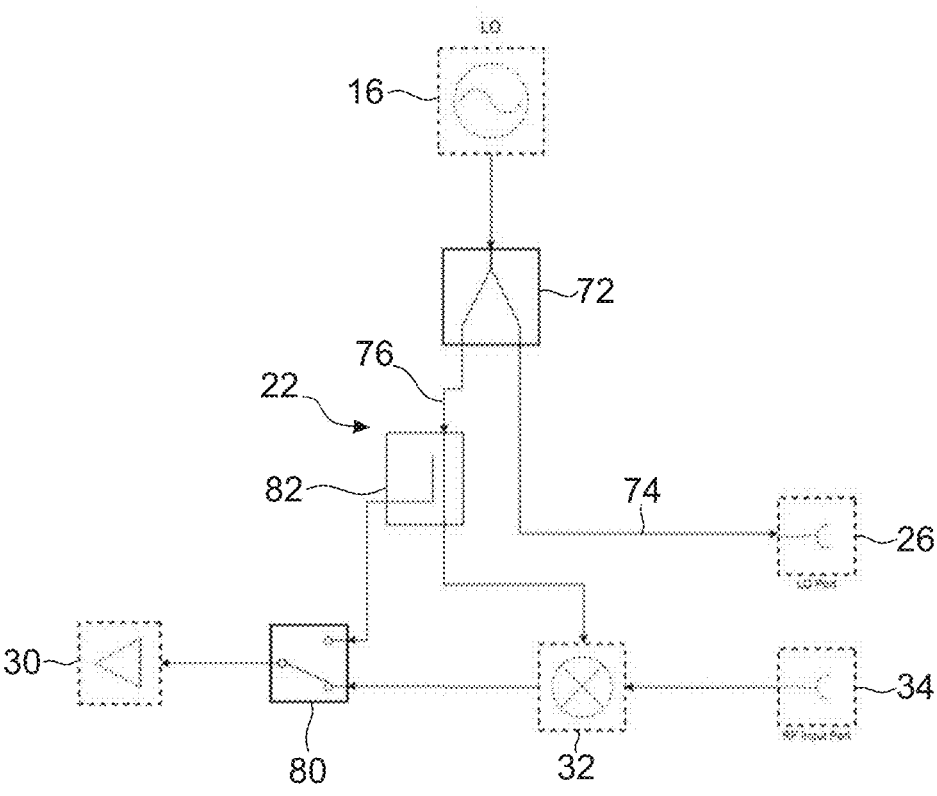
FIG. 5 shows yet another example of a signal distribution circuit of the test and/or measurement system according an embodiment of the present disclosure.
FIG. 6 shows a still another example of a signal distribution circuit of the test and/or measurement system according an embodiment of the present disclosure.

FIG. 5 shows another example embodiment of the first signal distribution circuit 22 that is associated with the first measurement mode and the adjustment mode described above. Compared to the example described above with respect to FIG. 3, the first switching circuit 78 is replaced by a first directional coupler 82, which is configured to forward the LO signal to both the second switching circuit 80 and to the first frequency converting circuit 32.

FIG. 6 shows another example embodiment of the first signal distribution circuit 22 that is associated with the second measurement mode and the adjustment mode described above. Compared to the example described above with respect to FIG. 4, the power divider 72 is replaced by a second directional coupler 84, which is configured to forward the LO signal to both the second switching circuit 80 and to the first LO port 26.

It is to be understood that further variations and/or combinations of the example embodiments of the first signal distribution circuit 22 described above are possible, and are within the scope of the claimed subject matter.

As already described above, in the adjustment mode, the processing circuit 66 receives the first digitized LO signal and the second digitized LO signal. Optionally, the LO signal generated by the LO circuit 16 in the adjustment mode may be a baseband signal in order to bypass an LO suppression that may be provided by the signal adjustment circuits 30, 44.

In general, the processing circuit 66 is configured to determine a phase drift between the first digitized LO signal and the second digitized LO signal based on the first digitized LO signal and the second digitized LO signal received in the adjustment mode, namely in order to correct phase drift occurring in the test and/or measurement system 10, and/or in order to synchronize the first measurement circuit 12 with the second measurement circuit 14.

For example, the processing circuit 66 may be configured to determine the phase drift by applying a correlation operation to the first digitized LO signal and the second digitized LO signal. In an embodiment, the correlation operation may comprise determining a cross-correlation between the digitized LO signals. In another embodiment, the correlation operation may comprise a fit function that is applied to the digitized LO signals. In another embodiment, the correlation operation may comprise a multiplication of the first digitized LO signal and the second digitized LO signal, for example a convolution of the first digitized LO signal with the second digitized LO signal.

In an embodiment, the test and/or measurement system 10 is configured to adapt a frequency of the LO signal generated by the LO circuit 16 and/or a phase of the LO signal generated by the LO circuit 16 at least once during the adjustment mode, such that at least two different LO signals having different frequencies and/or phases are generated.

Figure 7:
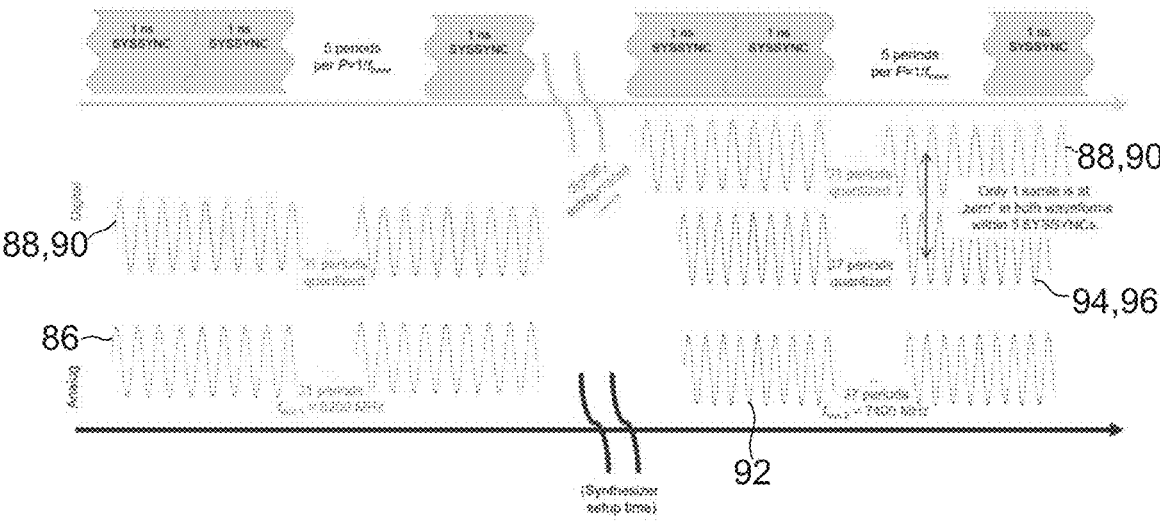
FIG. 7 shows a diagram illustrating a synchronization performed by the test and/or measurement system according to an embodiment of the present disclosure.

In an embodiment, the processing circuit 66 may be configured to control the LO circuit 16 to generate the at least two different LO signals having different frequencies and/or phases. An example of this procedure is illustrated in FIG. 7. The LO circuit 16 first generates an LO signal 86 having a first auxiliary frequency faux, 1, which is digitized by both the first ADC 24 and the second ADC 40, thereby obtaining the corresponding first digitized LO signal 88 and the corresponding second digitized LO signal 90.

It is noted that, of course, the first digitized LO signals 88 and the corresponding second digitized LO signal 90 are actually time-displaced with respect to each other, but this time-displacement is not shown in FIG. 7 for illustration purposes.

After a certain time period, the LO circuit 16 generates an LO signal 92 having a second auxiliary frequency faux, 2, which is digitized by both the first ADC 24 and the second ADC 40, thereby obtaining the corresponding first digitized LO signal 94 and the corresponding second digitized LO signal 96.

In an embodiment, the processing circuit 66 digitally extrapolates the digitized LO signals 88, 90. The processing circuit 66 may then determine a first reference time at which both first digitized LO signals 88, 94 have a zero-crossing simultaneously. Further, the processing circuit 66 may determine a second reference time at which both second digitized LO signals 90, 94 have a zero-crossing simultaneously.

By choosing appropriate auxiliary frequencies faux, 1 and faux, 2, the phase drift between the digitized LO signals can be determined with large accuracy. It is noted that the values faux, 1=6200 MHz and faux, 1=7400 MHz shown in FIG. 7 are purely examples.

For example, the different auxiliary frequencies may be chosen to be a base frequency fbase multiplied with different prime numbers. This ensures that all ambiguities are resolved and that there is only a single simultaneous zero-crossing within several clock cycles of the reference clock signal ("SYSSYNC" in FIG. 7).

Determining the first reference time and the second reference time allows to precisely match corresponding samples of the first ADC 24 and of the second ADC 40, as the sample of the first ADC 24 at the first reference time has to correspond to the sample of the second ADC 40 at the second reference time. Thus, the measurement circuits 12, 14 can be synchronized in a particularly precise manner.

In an embodiment, the phase drift between the digitized LO signals obtained in the adjustment mode can be used to correct phase drifts between the digitized measurement signals in the first measurement mode and/or in the second measurement mode.

Figure 8:
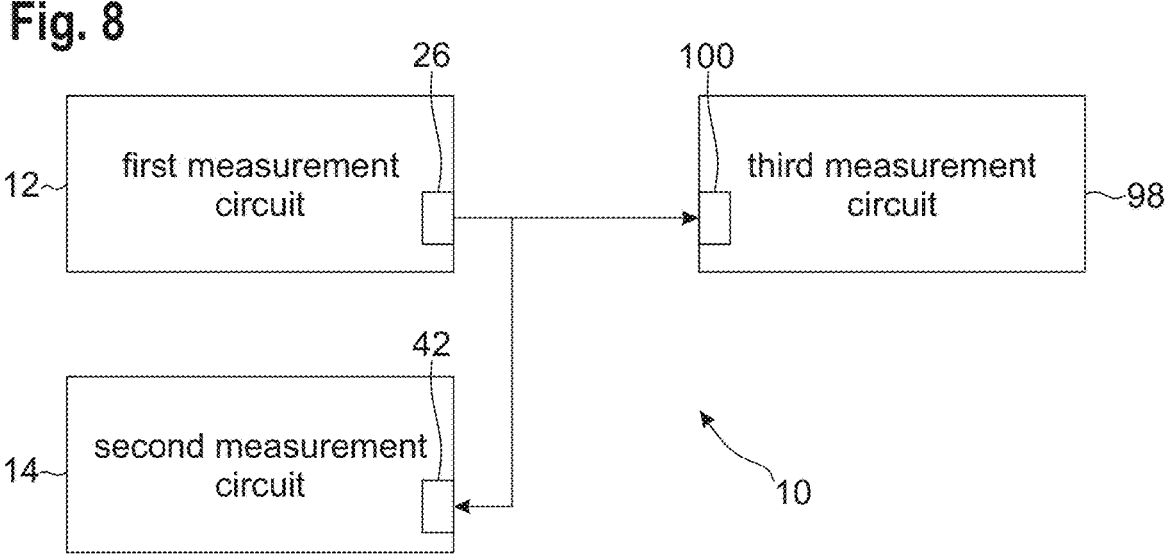
FIG. 8 shows another example of a test and/or measurement system according to an embodiment of the present disclosure.

As is further illustrated in FIG. 8, the synchronization and/or phase drift correction procedure described above can be extended to an arbitrary number of measurement circuits.

In the example embodiment shown in FIG. 8, the test and/or measurement system 10 further comprises a third measurement circuit 98, which may be established identically to the first measurement circuit 12 and/or the second measurement circuit 14. The third measurement circuit 98 comprises a third LO port 100 that is configured to receive the LO signal.

In the embodiment shown in FIG. 8, the LO signal is distributed to the second LO port 42 and to the third LO port 100 by a star connection.

Figure 9:
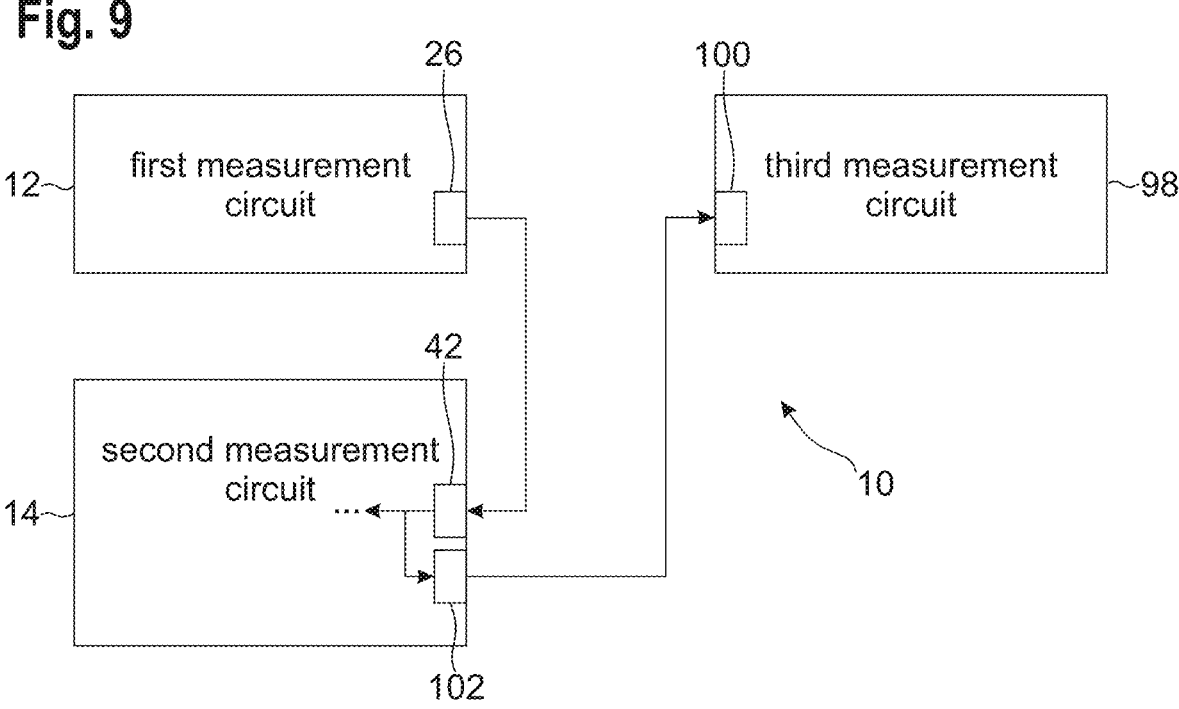
FIG. 9 shows yet another example of a test and/or measurement system according to an embodiment of the present disclosure.

In the embodiment shown in FIG. 9, the measurement circuits 12, 14, 98 are connected in series, i.e. in a "daisy chain" manner.

In an embodiment, the second measurement circuit 14 may comprise an LO through port 102, which is connected to the second LO port 42 and the third LO port 100. Thus, the LO signal is forwarded from the first LO port 26 to the third LO port 100 via the second LO port 42 and the LO through port 102.

The synchronization and/or phase drift correction procedure described above can be applied to the measurement circuits 12, 14, 98 in a pairwise manner or to all measurement circuits 12, 14, 98 simultaneously.

Certain embodiments disclosed herein include systems, apparatus, modules, units, devices, components, etc., that utilize circuitry (e.g., one or more circuits) in order to implement standards, protocols, methodologies or technologies disclosed herein, operably couple two or more components, generate information, process information, analyze information, generate signals, encode/decode signals, convert signals, transmit and/or receive signals, control other devices, etc. Circuitry of any type can be used. It will be appreciated that the term "information" can be use synonymously with the term "signals" in this paragraph. It will be further appreciated that the terms "circuitry," "circuit," "one or more circuits," etc., can be used synonymously herein.

In an embodiment, circuitry includes, among other things, one or more computing devices such as a processor (e.g., a microprocessor), a central processing unit (CPU), a digital signal processor (DSP), an application-specific integrated circuit (ASIC), a field programmable gate array (FPGA), a system on a chip (SoC), or the like, or any combinations thereof, and can include discrete digital or analog circuit elements or electronics, or combinations thereof. In an embodiment, circuitry includes hardware circuit implementations (e.g., implementations in analog circuitry, implementations in digital circuitry, and the like, and combinations thereof).

In an embodiment, circuitry includes combinations of circuits and computer program products having software or firmware instructions stored on one or more computer readable memories that work together to cause a device to perform one or more protocols, methodologies or technologies described herein. In an embodiment, circuitry includes circuits, such as, for example, microprocessors or portions of microprocessor, that require software, firmware, and the like for operation. In an embodiment, circuitry includes an implementation comprising one or more processors or portions thereof and accompanying software, firmware, hardware, and the like.

For example, the functionality described herein can be implemented by special purpose hardware-based computer systems or circuits, etc., or combinations of special purpose hardware and computer instructions. Each of these special purpose hardware-based computer systems or circuits, etc., or combinations of special purpose hardware circuits and computer instructions form specifically configured circuits, machines, apparatus, devices, etc., capable of implementing the functionality described herein.

In an embodiment, one or more of the components of first measurement circuit 12, the second measurement circuit 14, the processing circuit 66, the third measurement circuit 98, etc., referenced above include circuitry programmed to carry out the methodology or functionality disclosed herein. In an embodiment, one or more computer-readable media associated with or accessible by such circuitry contains computer readable instructions embodied thereon that, when executed by such circuitry, cause the component or circuity to carry out the methodology or functionality disclosed herein.

In an embodiment, the computer readable instructions includes applications, programs, program modules, scripts, source code, program code, object code, byte code, compiled code, interpreted code, machine code, executable instructions, and/or the like (also referred to herein as executable instructions, instructions for execution, program code, computer program instructions, and/or similar terms used herein interchangeably).

In an embodiment, computer-readable media is any medium that stores computer readable instructions, or other information non-transitorily and is directly or indirectly accessible to a computing device, such as processor circuitry, etc., or other circuity disclosed herein etc. In other words, a computer-readable medium is a non-transitory memory at which one or more computing devices can access instructions, codes, data, or other information. As a non-limiting example, a computer-readable medium May include a volatile random access memory (RAM), a persistent data store such as a hard disk drive or a solid-state drive, or a combination thereof. In an embodiment, memory can be integrated with a processor, separate from a processor, or external to a computing system.

Accordingly, blocks of the block diagrams and/or flowchart illustrations support various combinations for performing the specified functions, combinations of operations for performing the specified functions and program instructions for performing the specified functions. These computer program instructions may be loaded onto one or more computer or computing devices, such as special purpose computer(s) or computing device(s) or other programmable data processing apparatus(es) (e.g., processor circuits) to produce a specifically-configured machine, such that the instructions which execute on one or more computer or computing devices or other programmable data processing apparatus implement the functions specified in the flowchart block or blocks and/or carry out the methods described herein. Again, it should also be understood that each block of the block diagrams and flowchart illustrations, and combinations of blocks in the block diagrams and/or flowchart illustrations, or portions thereof, could be implemented by special purpose hardware-based computer systems or circuits, etc., that perform the specified functions or operations, or combinations of special purpose hardware and computer instructions.

In the foregoing description, specific details are set forth to provide a thorough understanding of representative embodiments of the present disclosure. It will be apparent to one skilled in the art, however, that the embodiments disclosed herein may be practiced without embodying all of the specific details. In some instances, well-known process steps have not been described in detail in order not to unnecessarily obscure various aspects of the present disclosure.

In the detailed description herein, references to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. In addition, when a particular feature, structure, or characteristic is described in connection with an embodiment, it is submitted that it is within the knowledge of one skilled in the art to affect such feature, structure, or characteristic in connection with other embodiments whether or not explicitly described. After reading the description, it will be apparent to one skilled in the relevant art(s) how to implement the disclosure in alternative embodiments. Thus, it will be appreciated that embodiments of the present disclosure may employ any combination of features described herein. All such combinations or sub-combinations of features are within the scope of the present disclosure.

Throughout this specification, terms of art may be used. These terms are to take on their ordinary meaning in the art from which they come, unless specifically defined herein or the context of their use would clearly suggest otherwise.

The drawings in the FIGURES are not to scale. Similar elements are generally denoted by similar references in the FIGURES. For the purposes of this disclosure, the same or similar elements may bear the same references. Furthermore, the presence of reference numbers or letters in the drawings cannot be considered limiting, even when such numbers or letters are indicated in the claims.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A and B" is equivalent to "A and/or B" or vice versa, namely "A" alone, "B" alone or "A and B.". Similarly, the phrase "at least one of A, B, and C," for example, means (A), (B), (C), (A and B), (A and C), (B and C), or (A, B, and C), including all further possible permutations when greater than three elements are listed.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A test and/or measurement system, the test and/or measurement system comprising:
   a first measurement circuit including a local oscillator (LO) circuit that is configured to generate an LO signal, a first signal distribution circuit, a first analog-to-digital converter (ADC), and a first LO port, wherein the first signal distribution circuit is configured to receive the LO signal and to forward the LO signal to the first LO port,
   a second measurement circuit including a second signal distribution circuit, a second ADC, and a second LO port,
   a processing circuit that is connected to both the first ADC and the second ADC,
   wherein the second LO port is connected to the first LO port so as to receive the LO signal from the first LO port, and wherein the second LO port is connected to the second signal distribution circuit such that the LO signal is forwarded from the second LO port to the second signal distribution circuit,
   wherein the test and/or measurement system has an adjustment mode, wherein, in the adjustment mode, the first signal distribution circuit is configured to forward the LO signal to the first ADC and the second signal distribution circuit is configured to forward the LO signal to the second ADC, wherein the first ADC is configured to digitize the LO signal, thereby obtaining a first digitized LO signal, wherein the second ADC is configured to digitize the LO signal, thereby obtaining a second digitized LO signal, and wherein the processing circuit is configured to receive the first digitized LO signal and the second digitized LO signal.

2. The test and/or measurement system of claim 1, wherein the processing circuit is configured to determine a phase drift between the first digitized LO signal and the second digitized LO signal based on the first digitized LO signal and the second digitized LO signal received in the adjustment mode.

3. The test and/or measurement system of claim 2, wherein the processing circuit is configured to determine the phase drift by applying a correlation operation to the first digitized LO signal and the second digitized LO signal received in the adjustment mode.

4. The test and/or measurement system of claim 1, wherein the test and/or measurement system is configured to adapt a frequency of the LO signal generated by the LO circuit and/or a phase of the LO signal generated by the LO circuit at least once during the adjustment mode, such that at least two different LO signals having different frequencies and/or phases are generated.

5. The test and/or measurement system of claim 4, wherein the first ADC is configured to digitize the at least two different LO signals, thereby obtaining at least two different first digitized LO signals, wherein the second ADC is configured to digitize the at least two different second LO signals, thereby obtaining at least two different second digitized LO signals, and
   wherein the processing circuit is configured to determine a phase drift between the first digitized LO signal and the second digitized LO signal based on the at least two different first digitized LO signals and based on the at least two different second digitized LO signals received in the adjustment mode.

6. The test and/or measurement system of claim 1, further comprising a first signal adjustment circuit and/or a second signal adjustment circuit,
   wherein the first signal adjustment circuit is interconnected between the first signal distribution circuit and the first ADC, wherein the first signal adjustment circuit is configured to amplify, filter, and/or attenuate a signal received from the first signal distribution circuit, and
   wherein the second signal adjustment circuit is interconnected between the second signal distribution circuit and the second ADC, wherein the second signal adjustment circuit is configured to amplify, filter, and/or attenuate a signal received from the second signal distribution circuit.

7. The test and/or measurement system of claim 1, wherein the first measurement circuit further comprises a first frequency converting circuit and a first RF port, and/or wherein the second measurement circuit further comprises a second frequency converting circuit and a second RF port,
   wherein the first RF port is configured to receive a first measurement signal, wherein the first frequency converting circuit is connected to the first RF port, wherein the first frequency converting circuit is configured to down-convert the first measurement signal to an intermediate frequency, and wherein the first signal distribution circuit is configured to selectively connect the first frequency converting circuit or the first RF port to the first ADC,
   wherein the second RF port is configured to receive a second measurement signal, wherein the second frequency converting circuit is connected to the second RF port, wherein the second frequency converting circuit is configured to down-convert the second measurement signal to an intermediate frequency, and wherein the second signal distribution circuit is configured to selectively connect the second frequency converting circuit or the second RF port to the second ADC.

8. The test and/or measurement system of claim 7, wherein the test and/or measurement system has a first measurement mode, wherein, in the first measurement mode, the first signal distribution circuit is configured to forward the LO signal to both the first LO port and the first frequency converting circuit, and wherein the second distribution circuit is configured to forward the LO signal from the second LO port to the second frequency converting circuit.

9. The test and/or measurement system of claim 7, wherein the test and/or measurement system has a second measurement mode, wherein, in the second measurement mode, the first signal distribution circuit is configured to forward the first measurement signal to the first ADC, and wherein the second signal distribution circuit is configured to forward the second measurement signal to the second ADC.

10. The test and/or measurement system of claim 9, wherein, in the second measurement mode, a signal path between the first RF port and the first ADC is free of frequency converting circuits, and wherein a signal path between the second RF port and the second ADC is free of frequency converting circuits.

11. The test and/or measurement system of claim 7, wherein the first ADC is configured to digitize the first measurement signal, thereby obtaining a first digitized measurement signal, wherein the second ADC is configured to digitize the second measurement signal, thereby obtaining a second digitized measurement signal.

12. The test and/or measurement system of claim 11, wherein the processing circuit is configured to determine a phase drift between the first digitized LO signal and the second digitized LO signal based on the first digitized LO signal and the second digitized LO signal received in the adjustment mode, and wherein the processing circuit is configured to correct a phase drift between the first digitized measurement signal and the second digitized measurement signal based on the phase drift determined.

13. The test and/or measurement system of claim 1, further comprising a third measurement circuit, wherein the third measurement circuit comprises a third signal distribution circuit, a third ADC, and a third LO port, wherein the third LO port is connected to the first LO port so as to receive the LO signal.

14. The test and/or measurement system of claim 1, further comprising a third measurement circuit, wherein the third measurement circuit comprises a third signal distribution circuit, a third ADC, and a third LO port, wherein the third LO port is connected to the second LO port so as to receive the LO signal.

15. The test and/or measurement system of claim 1, further comprising a third measurement circuit, wherein the third measurement circuit comprises a third signal distribution circuit, a third ADC, and a third LO port, wherein the third LO port is connected to the first LO port so as to receive the LO signal, and wherein the third LO port is connected to the third signal distribution circuit such that the LO signal is forwarded from the third LO port to the third signal distribution circuit, wherein, in the adjustment mode, the third ADC is configured to digitize the LO signal, thereby obtaining a third digitized LO signal, and wherein the processing circuit is configured to receive the third digitized LO signal.

16. The test and/or measurement system of claim 15, wherein the processing circuit is configured to determine a phase drift between the first digitized LO signal, the second digitized LO signal, and the third digitized LO signal based on the first digitized LO signal, the second digitized LO signal, and the third digitized LO signal received in the adjustment mode.

17. The test and/or measurement system of claim 1, wherein the first measurement circuit and the second measurement circuit are provided on separate circuit boards and/or in separate housings.

18. The test and/or measurement system of claim 1, wherein the processing circuit is integrated into the first measurement circuit and/or the second measurement circuit.

19. The test and/or measurement system of claim 1, wherein the processing circuit is provided separately from the first measurement circuit and the second measurement circuit.

20. The test and/or measurement system of claim 1, wherein the first signal distribution circuit comprises at least one of a directional coupler, a power divider, a switch, a splitter, or a diplexer.

\* \* \* \* \*